United States Patent [19]

Venkatesan et al.

[11] Patent Number: 5,015,492

[45] Date of Patent: May 14, 1991

[54] METHOD AND APPARATUS FOR PULSED ENERGY INDUCED VAPOR DEPOSITION OF THIN FILMS

[75] Inventors: Thirumalai Venkatesan, Bridgewater; Xin D. Wu, Highland Park, both of N.J.

[73] Assignees: Rutgers University, Piscataway; Bell Communications Research, Inc., Livingston, both of N.J.

[21] Appl. No.: 331,795

[22] Filed: Apr. 3, 1989

[51] Int. Cl.[5] .......................... B05D 3/06; C23C 14/00
[52] U.S. Cl. ........................................ 427/8; 427/42; 427/53.1; 118/620; 118/641; 118/50.1; 118/726; 118/712
[58] Field of Search ..................... 427/42, 53.1, 248.1, 427/38, 8, 10; 118/50.1, 620, 726, 708, 712, 641; 204/192.11

[56] References Cited

U.S. PATENT DOCUMENTS

| | | | |
|---|---|---|---|
| 3,645,786 | 2/1972 | Tannenberger et al. | 427/42 |
| 3,655,430 | 4/1972 | Greaves | 427/42 |
| 4,128,121 | 12/1978 | Sigsbee | 164/46 |
| 4,222,783 | 9/1980 | Atsumi et al. | 106/73.32 |
| 4,286,545 | 9/1981 | Takagi et al. | 118/723 |
| 4,604,429 | 8/1986 | Tanaka et al. | 427/53.1 |
| 4,619,691 | 10/1986 | Araya et al. | 75/0.5 B |
| 4,816,293 | 3/1989 | Hiramoto et al. | 427/53.1 |

FOREIGN PATENT DOCUMENTS

62-81003  4/1987  Japan .

OTHER PUBLICATIONS

Burton, et al. "Laser Deposition of YBa$_2$Cu$_3$O$_{7-8}$ Thin Films", *American Vac. Soc. Series* 3, ed. Lucovsky; 11/6/87.
Bartholomew et al, "Low temp. Syn. of High-Tc Superconducting Thin Films by Laser Assisted Reactive Dep."; *High-Temp. Supercond.* II, 4/88.
Lynds et al, "Supercond. Thin Films of (RE)Ba$_2$Cu$_3$(Ag)O$_{7-x}$ Prep. by Pulsed Laser Abation", *High-Temp. Supercond.*, Brodskey et al, ed.; 12/87.
Narayan et al, "Formation of Thin Supercond. Films by the Laser Processing Method", Appl. Phys. Lett, vol. 51, #22; Nov. 30, 1987.
D. Dijkkamp et al., "Preparation of Y—Ba—Cu oxide superconductor thin films using pulsed laser evaporation from high Tc bulk material," Aug. 24, 1987, 619-621, Appl. Phys. Lett 51(8).
T. Venkatesan, "Laser deposited high Tc superconducting thin films," Dec. 1987 3-41, Solid State Technology.
X. D. Wu et al., "A simple method to prepare high Tc superconducting thin films: pulsed laser deposition," 1988, 175-181, reprinted from Chemistry of Oxide Superconductors edited by C. N. R. Rao.

(List continued on next page.)

*Primary Examiner*—Stanley Silverman
*Assistant Examiner*—Marianne L. Padgett
*Attorney, Agent, or Firm*—Charles S. Phelan

[57] ABSTRACT

Vapor deposition of a thin film is accomplished by employing a pulsed laser to irradiate at least a region of a homogeneous stoichiometric complex material pellet with sufficient energy density to accomplish congruent evaporation of constituents of the material. The energy density is further at least sufficient to cause at least a predetermined portion, a central forward lobe, of the evaporant to have approximately the same stoichiometry as the irradiated material. A substrate is positioned to allow deposit thereon of that lobe portion of the evaporant as a thin film. Also shown are apparatus for masking out predetermined portions of the evaporant outside said lobe and passing at least a part of the lobe evaporant through a mask aperture, use of apparatus for causing relative movement of the substrate and the mask to achieve film deposition over a substrate area substantially larger than the area of the aperture, apparatus for charge level detection in the evaporant stream to detct lobe drift, and apparatus for tilting the pellet to compensate for drift of the forward lobe away from the mask aperture.

22 Claims, 2 Drawing Sheets

OTHER PUBLICATIONS

T. Venkatesan et al., "Observation of two distinct components during pulsed laser deposition of high Tc superconducting films," Apr. 4, 1988, app. Phys. Lett. 52(14).

C. C. Chang et al., "Smooth high Tc Y1Ba2Cu3Ox films by laser deposition at 650 Degrees C.," Aug. 8, 1988, 517–519, App. Phys. Lett. 53 (6).

X. D. Wu et al., "Advances in the Laser Deposition of High Tc Oxide Superconducting Films at Bellcore/Rutgers," Aug. 24–26, 1988, Extended Abstracts of the 20th (1988 International) Conference on Solid State Devices and Materials, pp. 439–442.

A. Inam et al., "As-deposited high Tc and Jc superconducting thin films made at low temperatures," Sep. 5, 1988, 908–910, Appl. Phys. Lett. 53(10).

T. Venkatesan et al., "Advances in Processing High-Temperature Superconducting Thin Films with Lasers," Sep. 25–30, 1988, 234–264, Chapt. 19 of textbook derived from 1988 (Los Angeles)Symposium ACS Symposium Series 377–Chemistry of High-Temperature Superconductors II, D. L. Nelson et al. Editors.

T. Venkatesan et al., "Nature of the Pulsed Laser Process for The Deposition of High Tc Superconducting Thin Films," Oct. 10, 1988, 1431–1433, Appl. Phys. Lett. 53(15).

H. Sankur et al., "Formation of Dielectric and Semiconductor Thin Films by Laser-Assissted Evaporation," 271–284, Applied Physics A (Solids and Surfaces).

B. Dutta et al., "Pulsed Laser Deposition: A Viable Process for Superconducting Thin Films?," Feb. 1989, 106–109, Solid State Technology.

THRESHOLD ENERGY DENSITY FOR
STOICHIOMETRIC DEPOSITION

METHOD AND APPARATUS FOR PULSED ENERGY INDUCED VAPOR DEPOSITION OF THIN FILMS

INTRODUCTION

This invention relates to pulsed energy induced vapor deposition of a thin film of complex material.

BACKGROUND OF THE INVENTION

Several different processes have been employed for vapor deposition of thin films. Each has its own advantages and disadvantages. With the advent of superconductivity at relatively high temperatures, e.g. above 30° Kelvin, attention has been focused on certain inadequacies of prior techniques. Many materials, including at least some superconducting materials, include several chemically combined elements. Such a material is here called a complex material, i.e. one which comprises a number of elements of diverse vapor pressures in a specific ratio forming a compound with predetermined properties. Sputtering and co-evaporation have been employed for depositing films of superconducting materials; but both techniques require critical control of both deposition conditions and post-deposition annealing conditions. A Tanaka et al. U.S. Pat. No. 4,604,294 presented the idea of using a pulsed laser beam to evaporate an organic compound and then deposit all of the organic compound vapors in vacuum to form a thin film of the compound on a substrate surface. The film is said to have a chemical structure like that of the compound. U.S. Pat. No. 4,128,121 to Sigsbee and U.S. Pat. No. 4,286,545 to Takagi et al. teach separately evaporating different substances and then mixing the vapors prior to their deposit on a substrate.

Laser induced evaporation has been used for deposition of thin films applied to many materials. "Preparation of Y-Ba-Cu oxide superconductor thin films using pulsed laser evaporation from high $T_c$ bulk material" by D. Dijkkamp et al., Applied Physics Letters, Aug. 24, 1987, Vol. 51, No. 8, pages 619–621, shows the use of pulsed excimer laser evaporation from a bulk target to realize a film resulting from interception of the evaporant plume and having a composition within 10% of the composition of the target material. The target was in the form of a disk shaped pellet that was rotated to obtain a relatively constant deposition rate and to reduce texturing of the irradiated surface of the pellet. The film deposited exhibited a thickness variation in the center of the substrate on which the film was deposited. It has been found, however, that the asserted stoichiometry fidelity was not always reproducible.

SUMMARY OF THE INVENTION

Impact of the foregoing problems is significantly reduced by irradiating a target of a desired compound with a pulsed energy beam having pulses of sufficient energy density to evaporate the compound, in at least a portion of the target, substantially congruently, i.e. all elements of the compound are evaporated at substantially the same time regardless of their respective vapor pressures. That energy density is also sufficient that film formed by deposit of evaporant in a predetermined lobe of the evaporant plume is thicker than film deposited from outside the lobe, and it has a stoichiometry approximately the same as that of the irradiated target.

In one embodiment, a substantial part of the relatively non-stoichiometric portion of the evaporant plume is masked out so that primarily the stoichiometric portion is deposited on the substrate. Relative lateral displacement of the substrate and mask are used to deposit film on an area of the substrate that is larger than the area of the mask aperture projected upon the substrate.

BRIEF DESCRIPTION OF THE DRAWINGS

A more complete understanding of the invention and its various features, objects, and advantages can be obtained from a consideration of the following Detailed Description in connection with the appended claims and the attached drawings in which:

DETAILED DESCRIPTION

Figure 1:
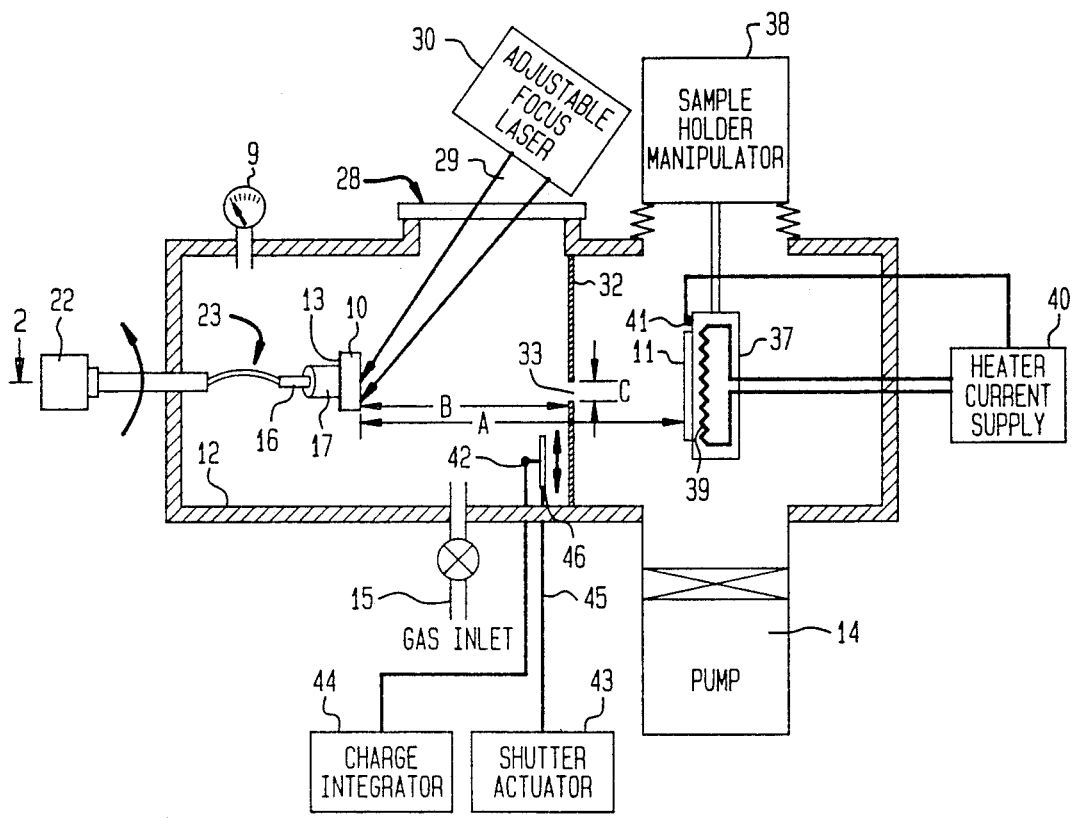
FIG. 1 is a schematic diagram of a side view of apparatus for a vapor deposition system utilizing pulsed energy induced evaporation in accordance with the present invention.

FIG. 1 depicts a schematic diagram of one hardware arrangement for implementing a pulsed energy induced vapor deposition method in accordance with the invention and in which the stoichiometry of a deposited film is approximately the same as that of a body of material from which the vapor is derived. Various energy beam types are available for the purpose and include, for example, laser light, electrons, ions, and neutral particles.

In FIG. 1, a target 10 and a substrate 11 are mounted in substantially parallel planes, and with centers on a line perpendicular to those planes, within a vacuum chamber 12. The chamber is illustrated in cross sectional form with the front half removed. Target 10 is a body comprising a homogeneous, complex material to be evaporated onto the substrate. To be homogeneous for this purpose, the material must exhibit the same composition in any random volume that can be examined in the material and which volume is of a size no more than about 1000 cubic nanometers. Illustratively, target 10 is a disk-shaped pellet of high critical temperature ($T_c$) superconducting material such as yttrium-barium-copper-oxide ($Y_1Ba_2Cu_3O_{7-x}$); and it is mounted on a pellet holder 13. A pump 14 is provided to draw down a vacuum in chamber 12; and a gas inlet 15 is provided to inject a charge of a suitable gas, typically oxygen for the illustrative superconducting material, when required. A gauge 9 indicates pressure conditions within chamber 12. The circumstances under which one would operate in a vacuum or in an atmosphere of a particular gas comprise no part of the present invention.

Figure 2:
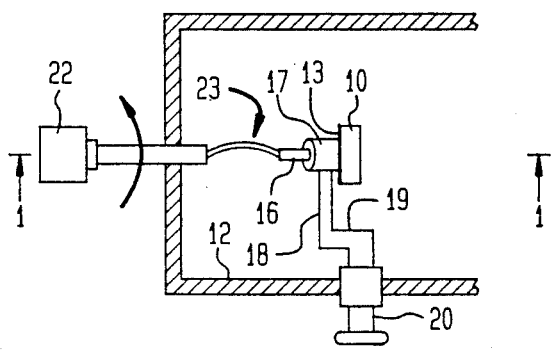
FIG. 2 is a top view of a pellet tilting portion of the apparatus of FIG. 1.

For reasons to be discussed subsequently, holder 13 is advantageously mounted both for rotation about an axis perpendicular to a major surface of pellet 10 and extending through the center of pellet 10 and for pivoting about an axis through that same center and perpendicular to the plane of the FIG. 1 drawing. To that end, pellet holder 13 is further mounted on one end of a rod 16 which, in rest, has its longitudinal center line coextensive with a line including the center of the major surface of pellet 10 facing substrate 11. Rod 16 is held rotatably, about its mentioned longitudinal center line, in a collar 17 adjacent to holder 13. Collar 17 is supported pivotally at the end of a crank arm 18 (best seen in a top view in FIG. 2) that is connected through a short perpendicular crank arm member 19 to a rod 20 that extends rotatably through the side wall of chamber 12. FIG. 2 is a partial cross section taken at a plane indicated by a line 2 in FIG. 1. The axis of rotation of rod 20 is collinear with a diameter of the surface of pellet 10 facing substrate 11. Thus, when rod 20 is turned, pellet 10 is tilted about that diameter, i.e. to face either more directly toward or away from an incident laser beam 29 (FIG. 1) to be further discussed.

Rod 16 is driven in rotation by a motor 22 that has its drive shaft extended through a wall of chamber 12 and coupled to the left-hand (as illustrated) end of rod 16 through a section of flexible drive cable 23. The rotation of rod 16 likewise turns pellet 10 during vapor deposition to reduce the rate of texturing of the irradiated surface, as is known in the art.

To accomplish vapor deposition, an energy beam is directed onto a body of material such as the pellet 10 to energize the material sufficiently to accomplish evaporation. It is known that the beam must have sufficient energy density to produce congruent evaporation, i.e. to evaporate all components of a mixture at approximately the same time regardless of their different vapor pressures. However, it has been further found that, if the beam energy density is maintained within a predetermined energy density window for a particular complex material, reproducible, high quality (i.e. good stoichiometric fidelity), film deposition results. Thus, if the energy density is of at least a predetermined threshold value for a particular complex material to be evaporated, the stoichiometry of the material is preserved in a critical part of the evaporant and deposited on the substrate with approximately the same stoichiometry. If beam energy density is below that threshold, non-stoichiometric films are deposited. On the other hand, if beam energy density is above a predetermined upper threshold value for the particular complex material, particulates with sizes up to a few microns are ejected from the target; and the resulting deposited film has a relatively rough texture and otherwise degraded properties; but the stoichiometry is still preserved.

Moreover, it has been further found that, when beam energy density is within the described energy density window, there also is a spatial window in which the film deposit is stoichiometric while any region of a film deposit outside that spatial window is primarily non-stoichiometric. In this context, a stoichiometric deposit or evaporant is one having approximately the same composition proportions as those of the pellet from which it was evaporated. On the other hand, a non-stoichiometric deposit or evaporant is one having substantially different composition proportions as compared to those of the pellet. That spatial window is found about the point of intersection of the substrate 11 surface by a line, sometimes called a forward normal, perpendicular to the pellet 10 surface at the center of the spot irradiated by the energy beam. It has been found experimentally that the edge of the spatial window can be defined by the portion of the surface of substrate 11 subtended by a series of cones having elements extending from respective different points, including the center, of the irradiated spot on pellet 10 at about 20° from their respective central axes (a total of about 35° from the forward normal), all such axes being parallel to the forward normal. The embodiment of FIG. 1 is adapted, as will be further described, to achieve reproducibly the deposition of films having approximately the same stoichiometry as the material of the target from which the film material was evaporated.

In order to achieve congruent evaporation, it is necessary that the complex material that is to be evaporated be heated as rapidly as possible. To that end, energy of the irradiating beam particles (i.e. photons, electrons, ions, neutrals, depending upon the type of beam being used) must be at least sufficient to produce congruent evaporation of the complex material at the irradiated surface. On the other hand, if there is excessive particle energy, the beam will penetrate to substantial depths without adequately heating the surface material for congruent evaporation. Accordingly, it is useful to limit energy beam penetration to a depth, for the complex material to be evaporated, that will concentrate the heat in a useful depth range near the irradiated surface. In the case of a laser, the particle energy is a function of wavelength; the shorter the wavelength, the less is the penetration before substantially all of the beam energy is absorbed by the material. For the illustrative superconducting material, the maximum permissible depth for laser beam penetration to achieve congruent evaporation is about 500 nanometers.

A top (as illustrated in FIG. 1) wall of chamber 12 comprises a quartz window 28 through which a focused laser beam 29 is projected from an adjustable focus laser 30. For the illustrative example of laser deposition of a film of high $T_c$ superconductive material $Y_1Ba_2Cu_3O_{7-x}$ evaporated from a stoichiometric target pellet 10 of the same material, an excimer pulsed laser is employed having a 248 nanometer (nm) wavelength, a pulse length of 30 nanoseconds (ns), and a pulse energy density of about 1.5 joules per square centimeter ($J/cm^2$). The laser beam 29 is directed at an angle of about 45° through the quartz window 28 and focused to an elliptical spot of about 2 by 3 millimeters on the surface of the pellet 10 to produce the indicated energy density on that surface. The major axis of the ellipse extends radially in the region between the center and circumference of the pellet surface; so that the track from which material is evaporated as the pellet rotates is annular in shape.

Figure 3:
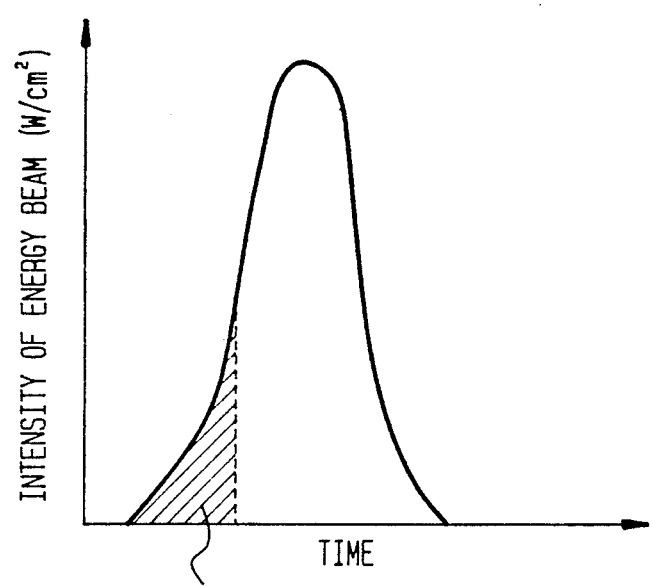
FIG. 3 is an energy density versus time diagram to facilitate an understanding of the invention.

FIG. 3 illustrates a typical intensity (in watts/cm²) versus time diagram of an energy pulse from laser 30. The pulse has finite slope leading and trailing edges since no special measures were taken to increase the slope. A threshold cumulative energy density is required to be absorbed before congruent evaporation to achieve stoichiometric deposition is obtained. For the illustrative superconducting material, this requires a pulse energy density of 1 Joule/cm² over the entire laser pulse. Using such laser pulses, films have been produced in which the central stoichiometric region has a composition that is within about 5% of the composition of the pellet 10 employing the laser and pellet material mentioned above. If pulse energy density is increased or decreased, the portion of the pulse that produces good stoichiometric fidelity also increases or decreases correspondingly.

Figure 4:
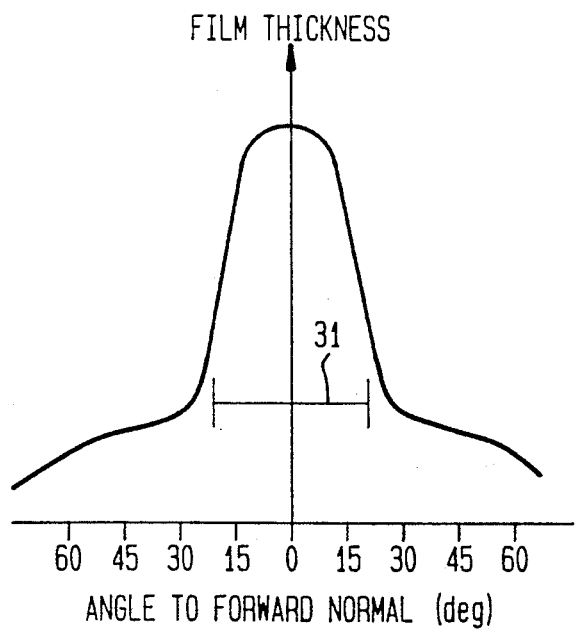
FIG. 4 is a film thickness versus angle with respect to forward normal diagram to facilitate an understanding of the invention.

FIG. 4 depicts a film thickness versus angle to forward normal characteristic for a film deposited as a result of affording the evaporant plume, resulting from irradiation of a unit spot at the forward normal to the irradiated ellipse of pellet 10, relatively unimpeded access for deposition on the surface of substrate 11. The illustrated characteristic is taken in the plane of both the forward normal and the major axis of the elliptical irradiation spot on pellet 10, i.e. in the plane of the drawing FIG. 1; but a similarly configured characteristic results both in any other plane including the forward normal and in respect to the normal to any other unit spot in the irradiated ellipse. It can be seen that the thickness of the deposited film varies across the characteristic. Stoichiometry of material is essentially preserved out to about 20° from a normal to any point in the irradiated region on pellet 10 and in a region of maximum thickness, and stoichiometry is maintained overall out to about 35° from the forward normal as previously mentioned. The overall central region, i.e. the composite of the ±20° region 31 in FIG. 4 for all points in the irradiated spot of pellet 10, is sometimes called the stoichiometric lobe portion of the plume. That lobe portion includes some non-stoichiometric evaporant material evaporated during at least the leading edge time portion before reaching the FIG. 3 stoichiometric threshold of each pulse, but it includes primarily stoichiometric material, and it includes the greatest volume of the evaporant produced during a pulse interval. The amount of evaporant in the lobe increases and decreases with the pulsed beam energy density level.

Measurements of charge in the evaporant plume have shown highest charge in the plume flow stream in the aforementioned central lobe portion of the plume, that is in the region around the normal to the center of the irradiated spot on pellet 10. Within that lobe there is also a charge maximum at that normal. It has been found also that films deposited from unobstructed plume flow exhibit greatest thickness, highest stoichiometric fidelity, and best reproducibility in the film region deposited from the central lobe region of the plume.

It is useful to limit deposition access to substrate 11 to primarily the portion of the evaporant plume containing material with approximately the same stoichiometry as the pellet 10. One way to accomplish this is by a partition 32 installed across the chamber 12 in the evaporant path and having an aperture 33 located and configured to pass only evaporant material in the central, primarily stoichiometric portion of the plume, that is, in the lobe which is the composite of regions 31 illustrated in FIG. 4. Aperture 33 is advantageously circular and slightly smaller in diameter than the smallest cross sectional dimension of the evaporant lobe 36 to assure that no substantial amount of the non-stoichiometric part of the evaporant plume on either side of the lobe 36 gains access to the substrate 11. Otherwise the aperture size is not critical, keeping in mind that process efficiency is favored by larger sized apertures.

The actual size of the aperture 33 depends upon factors such as its relative location with respect to pellet 10 and substrate 11 since the lobe unobstructed cross sectional size increases as the evaporant travels from pellet to probe due to a spatial dispersive effect arising from concave erosion in the irradiated surface of the pellet as evaporation progresses. In the illustrative example, it has been found that the range of suitable aperture sizes, expressed as the radius $C/2$ of the aperture 33, in relation to the distance B between pellet face and aperture and the distance A between pellet face and substrate can be expressed in centimeters (cm) as:

$$2 \text{ cm} < A < 200 \text{ cm}$$

$$1 \text{ cm} < B < 200 \text{ cm}$$

$$0.01 < C/2B < 0.5.$$

The low values shown for dimensions A and B are presently imposed by limitations of available space for bringing in the laser beam at an angle in the illustrative embodiment. The upper values for A and B are not limitations; they simply represent upper values of sizes that one might want to use for method and apparatus of the type illustrated. It is apparent from a comparison of the above range for $C/2B$, i.e. the tangent of the angle with respect to the forward normal subtended by aperture 33, and FIG. 4 that selection of aperture size for a given irradiated spot size on the pellet is a compromise between compositional integrity of a deposited film and deposition efficiency. The compromise chosen will depend upon the requirements imposed for a particular film being deposited. For example, larger aperture angles reduce compositional integrity by allowing more non-stoichiometric fringe of the plume to pass, but they enhance deposition process efficiency by allowing more film to be deposited with a given set of positions for target, aperture, and substrate.

In one application of the illustrative embodiment, the 248 nanometer wavelength laser was focused on the yttrium-barium-copper-oxide target pellet in a spot of 2 by 3 mm to produce an energy density of 1.5 $J/cm^2$ on the surface as previously described. The spacing of target pellet 10 to a 5 mm aperture 33 was 4 cm, and the spacing of target pellet 10 to substrate 11 was 5 cm.

Of course, aperture configurations other than circular can be employed depending upon the configuration of the irradiation spot employed on the face of pellet 10. Also, one could take into account variation of lobe cross sectional configuration that occurs after evaporation periods of various lengths without resmoothing the face of the pellet.

If it should be useful in some applications to deposit a film over a large area, there are at least two possibilities. One is to scale up the sizes of pellet 10 and the cross section of the irradiating beam 29 as well as other elements of the illustrated apparatus. Another possibility is to cause relative transverse movement between aperture 33 and substrate 11. The latter alternative is illustrated in FIG. 1 where substrate 11 is secured to a sample holder 37 which is supported in position by a sample holder manipulator 38 which is advantageously operated to move holder 37 vertically (in the plane of the drawing) and horizontally (in a direction perpendicular to the plane of the drawing) to define a deposition raster in the path of evaporant in the lobe 36. One manipulator suitable for executing this raster-type algorithm is a sample holder manipulator Model VZSMPC sold by Vacuum Generators, in East Sussex, in the United Kingdom.

Stepping of holder 37 by manipulator 38 is calibrated in relation to the size C of aperture 33 so that successive substrate surface areas are presented in the path of the central lobe with as little area overlap as practical to assure complete area coverage. On successive raster scans for deposition of successive layers of film material to build up the desired film thickness, area positions are slightly offset to avoid having overlapped portions of successive layers on top of one another.

A heater element 39 is provided within the sample holder 37, and it is energized from a heater current supply 40 outside the chamber 12. A temperature sensing element 41 is mounted on holder 37 next to substrate 11 and connected back to the supply 40 to facilitate thermostatic control of substrate temperature. This facility is known in the art for appropriately heating substrates to assure appropriate crystallization of the deposited evaporant in the film on substrate 11.

During primarily the initial portions of a film deposition process, the position of lobe 36 tends to drift toward the beam 29, i.e. away from a centrally located position with respect to aperture 33. After some time of this drift it substantially stops. Since there is usually some texturing of the irradiated surface of pellet 10 in spite of the mentioned rotation of the pellet, it is believed that the drift is caused by the texturing of the pellet surface in such a way as to produce preferential erosion of material from surface features facing the laser beam. One way to compensate for the drift, so that the process need not be immediately shut down to resmooth the pellet, is to tilt the pellet by an appropriate amount to redirect the central lobe of the plume into aperture 33. To that end, a charge probe 42 is periodically moved into the center of the lobe cross section, upstream from, i.e. to the left of, the aperture 33. Probe 42 is electrically coupled to a charge integrator 44, e.g. an oscilloscope has been found to serve the purpose well, to indicate the evaporant charge level in the lobe 36. When that charge decreases from its maximum value, it is known that the lobe is drifting; and the pellet tilt adjustment described in connection with FIG. 2 is operated to steer the lobe to a position in which its central maximum charge region is substantially centered in aperture 33. The tilting axis for the pellet is advantageously located to affect no substantial change in the cross sectional configuration of lobe 36. Illustratively, that axis extends through a diameter of the irradiated surface of the pellet 10, which diameter includes the major axis of the elliptical irradiated spot.

In practice, it would not be desirable for probe 42 to be in the stream during actual deposition; and it would not be desirable for deposition to take place during probe measurements; but it also is not desirable to shut down the entire process each time probe measurements are to be made. Accordingly, probe 42 is advantageously mounted on a shutter 46; and a manually operated shutter actuator 43 is operated, through a drive rod 45 extending through the wall of chamber 12, to insert both probe 42 and shutter 46 into the stream of the lobe upstream of aperture 33. Probe 42 is inserted into the center of the stream, upstream from aperture 33, and at that point shutter 46 blocks access of the lobe evaporant to aperture 33. When the total deposition apparatus is being initialized, actuator 43 is turned on to position probe 42 and shutter 46 in the lobe as described; and the FIG. 2 tilting mechanism is operated to position pellet 10 for maximum detected charge in the center of the lobe 36 cross section. Operation of actuator 43 is then reversed to retract probe 42 and shutter 46 to allow deposition to proceed. Thereafter, at regular intervals during the deposition process, as appropriate for the particular material being evaporated, the charge measurement operation is repeated; and if it appears that the lobe has drifted, the tilting mechanism is operated to restore the lobe to its proper position. Although manual operation of the measurement and tilting apparatus have been described, it will be apparent to those skilled in the art that programmed automation of those functions is also possible.

Although the invention has been described in connection with a particular embodiment thereof, it will be apparent to those skilled in the art that additional embodiments, modifications, and applications which will be obvious to those skilled in the art are included within the spirit and scope of the invention.

What is claimed is:

1. A vapor deposition method for coating a substrate with a complex material having a predetermined stoichiometric set of constituents, the method comprising the steps of composing a pellet of said complex material, irradiating at least a portion of said pellet with a pulsed beam of at least sufficient energy to vaporize said constituents congruently in a three-dimensional plume adjacent to said pellet, said plume including a central lobe in which the amount of evaporant material is at least in part a function of said density and in which the evaporant stoichiometric characteristic is approximately the same as in said pellet, and intercepting on said substrate substantially only a portion of said evaporant plume in said central lobe.

2. The method in accordance with claim 1 in which said composing step comprises:

composing a homogeneous pellet of said complex material and exhibiting the same material in any random volume that can be examined in the material and which volume is of a size no more than about 1000 cubic nanometers.

3. The method in accordance with claim 1 in which said irradiating step comprises the substeps of directing a pulsed energy beam onto said pellet, each pulse of said beam having finite rise and fall times and having more than sufficient energy density to cause said congruent vaporization of a portion of said pellet, and adjusting the intensity of said beam to control the proportion of the duration of said each pulse having at least said sufficient energy density and hence to control said amount of evaporant in said lobe.

4. The method in accordance with claim 1 in which said irradiating step comprises:

selecting an energy beam having particle energy at least adequate to produce congruent evaporation of said material at the surface thereof but insufficient to penetrate to a depth at which congruent evaporation of significant amounts of said material at said surface is not possible.

5. The method in accordance with claim 1 and further comprising the step of tilting said pellet to steer said lobe in a predetermined direction toward said substrate.

6. The method in accordance with claim 5 in which said irradiating step comprises the substep of focusing said beam onto a predetermined region of said major face of said pellet, and said tilting step comprises tilting said pellet about an axis located to affect no substantial change in said amount of evaporant in said lobe during steering of said lobe.

7. A vapor deposition method for coating a substrate with a complex material having a predetermined stoichiometric set of constituents, the method comprising the steps of composing a pellet of said complex material, irradiating at least a portion of said pellet with a pulsed beam of at least sufficient energy to vaporize said constituents congruently in a three-dimensional plume adjacent to said pellet, said plume including a central lobe in which the amount of evaporant material is at least in part a function of said density and in which the evaporant stoichiometric characteristic is approximately the same as in said pellet, and intercepting on said substrate a portion of said evaporant plume in said central lobe, said intercepting step comprising the substep of blocking portions of said plume outside said lobe from deposition on said substrate.

8. The method in accordance with claim 7 in which said blocking step comprises the substep of inserting a mask having an aperture for passing at least a portion of said plume in said lobe between said pellet and said substrate to limit evaporant deposited on said substrate substantially to that which is in said lobe.

9. The method in accordance with claim 8 and comprising the further steps of:

detecting a drift of said lobe at least partially away from said aperture, and tilting said pellet in a direction to redirect said lobe through said aperture.

10. The method in accordance with claim 9 in which said detecting step comprises the substep of:

detecting electrical charge level in said evaporant in a predetermined portion of said lobe upstream in said evaporant from said aperture and at a point where said drift caused a change in said level.

11. The method in accordance with claim 8 in which said blocking step further comprises the substep of:

causing relative movement between said substrate and said mask in accordance with a predetermined algorithm to achieve deposition of evaporant over a predetermined area, greater than the area of said aperture, of said substrate.

12. The claim in accordance with claim 11 in which said causing step comprises the substep of:

moving said substrate in accordance with said algorithm.

13. Vapor deposition apparatus for directing an energy beam onto at least a portion of a body of a complex material to cause congruent evaporation of at least a portion of the material and depositing the resulting evaporant as a film on a substrate, said material having a predetermined homogeneous stoichiometric set of constituents, said apparatus comprising:

means, including said beam, for irradiating at least a portion of said material with at least sufficient energy density congruently to vaporize said constituents in a three-dimensional plume adjacent to said pellet, said plume including a central lobe in which the amount of evaporant is at least in part a function of said density and in which the evaporant stoichiometric characteristic is approximately the same as in said pellet; and means for intercepting substantially only a portion of said evaporant plume from said lobe on a substrate.

14. The vapor deposition apparatus in accordance with claim 13 in which said irradiating means comprises:

means for directing said beam as a pulsed energy beam onto said pellet, each pulse of said beam having finite rise and fall times and having more than sufficient energy density to cause said congruent vaporization of a portion of said pellet; and means for adjusting the energy density of said beam to control the proportion of the duration of said each pulse having at least said sufficient energy density and hence to control said amount of evaporant in said lobe.

15. The vapor deposition apparatus in accordance with claim 13 in which there are provided:

means for tilting said pellet to steer said lobe in a predetermined direction toward said substrate.

16. The vapor deposition apparatus in accordance with claim 15 in which:

said irradiating means comprises means for focusing said beam in a predetermined region of said major face of said pellet, and said tilting means comprises means for tilting said pellet about an axis including a line sufficiently close to said region to affect no substantial change in said amount of evaporant in said lobe.

17. Vapor deposition apparatus for directing an energy beam onto at least a portion of a body of a complex material to cause congruent evaporation of at least a portion of the material and depositing the resulting evaporant as a film on a substrate, said material having a predetermined homogeneous stoichiometric set of constituents, said apparatus comprising:

means, including said beam, for irradiating at least a portion of said material with at least sufficient energy density congruently to vaporize said constituents in a three-dimensional plume adjacent to said pellet, said plume including a central lobe in which the amount of evaporant is at least in part a function of said density and in which the evaporant stoichiometric characteristic is approximately the same as in said pellet; and means for intercepting a portion of said evaporant plume from said lobe on a substrate, said intercepting means comprising means for blocking predetermined portions of said plume outside said lobe from deposition on said substrate.

18. The vapor deposition apparatus in accordance with claim 17 in which said blocking means comprises:

means, including an aperture in the vapor projection path of said lobe between said pellet and said substrate, for masking out predetermined fringes of said evaporant outside said lobe and passing evaporant in said lobe for deposit on said substrate.

19. The vapor deposition apparatus in accordance with claim 18 and comprising:

means for detecting a drift of said lobe at least partially away from said aperture; and means for tilting said pellet in a direction to redirect said lobe through said aperture.

20. The vapor deposition apparatus in accordance with claim 19 in which said detecting means comprises:

means, in said evaporant upstream of said aperture, for detecting electrical charge level in said evaporant in a predetermined portion of said lobe.

21. The vapor deposition apparatus in accordance with claim 18 in which said blocking means further comprises:

means for causing relative movement between said substrate and said mask in accordance with a predetermined algorithm to achieve deposition of evaporant over a predetermined area, greater than the area of said aperture, of said substrate.

22. The vapor deposition apparatus in accordance with claim 21 in which said causing means comprises:

means for moving said substrate in accordance with said algorithm.

* * * * *